(12) United States Patent
Yampolsky

(10) Patent No.: US 7,307,362 B1
(45) Date of Patent: Dec. 11, 2007

(54) SOLID-STATE MICROSECOND CAPACITANCE CHARGER FOR HIGH VOLTAGE AND PULSED POWER

(76) Inventor: Joseph Yampolsky, 3030 Merrill Dr., #26, Torrance, CA (US) 90503

( * ) Notice: Subject to any disclaimer, the term of this patent is extended or adjusted under 35 U.S.C. 154(b) by 671 days.

(21) Appl. No.: 10/351,644

(22) Filed: Jan. 24, 2003

Related U.S. Application Data

(60) Provisional application No. 60/355,537, filed on Feb. 6, 2002.

(51) Int. Cl.
*H03K 3/53* (2006.01)
*H03K 3/021* (2006.01)

(52) U.S. Cl. ................. 307/108; 307/110; 323/208

(58) Field of Classification Search ............. 363/61, 363/60; 307/110, 107, 108; 323/208, 209, 323/365; 320/166; 315/128
See application file for complete search history.

(56) References Cited

U.S. PATENT DOCUMENTS

| | | | | | |
|---|---|---|---|---|---|
| 3,781,649 | A | * | 12/1973 | Ishida | 315/223 |
| 4,268,899 | A | * | 5/1981 | Rokas | 363/61 |
| 4,409,647 | A | * | 10/1983 | Terkanian | 363/27 |
| 4,922,396 | A | * | 5/1990 | Niggemeyer | 363/21.01 |
| 5,228,770 | A | * | 7/1993 | Brunson | 362/194 |
| 5,905,646 | A | * | 5/1999 | Crewson et al. | 363/132 |
| 6,104,147 | A | * | 8/2000 | Nakamura et al. | 315/289 |
| 6,188,180 | B1 | * | 2/2001 | Diamond | 315/289 |
| 6,411,133 | B1 | * | 6/2002 | Matsudai et al. | 327/65 |

FOREIGN PATENT DOCUMENTS

JP 08164320 A * 6/1996

* cited by examiner

*Primary Examiner*—Michael Sherry
*Assistant Examiner*—Andrew M. Deschere
(74) *Attorney, Agent, or Firm*—Knobbe, Martens, Olson & Bear, LLP

(57) ABSTRACT

A solid-state high-voltage pulse generator based on a three-phase chopper capacitance charger is described. In a first phase, an intermediate capacitor is resonance-charged via a diode. In a second phase, the intermediate capacitor is discharged to the load through one or more solid-state switches. In a third phase, the energy remaining in the intermediate capacitor is returned to a power-supply filter capacitor. In one embodiment, the three-phase chopper includes an intermediate capacitor that is charged by first and fourth branches of a bridge and discharged by second and third branches of a bridge. In one embodiment, each branch of the bridge includes a diode in series with an inductor. In one embodiment, a composite solid-state switch connects the intermediate capacitor to a primary winding of an output transformer such that the intermediate capacitor discharges through the primary winding. In one embodiment, a secondary winding of the output transformer is provided to an output load. In one embodiment, the output load is a reactive load. In one embodiment, the output load is a capacitive load.

29 Claims, 17 Drawing Sheets

SOLID-STATE MICROSECOND CAPACITANCE CHARGER FOR HIGH VOLTAGE AND PULSED POWER

REFERENCE TO RELATED APPLICATIONS

The present application claims priority benefit of U.S. Provisional Application No. 60/355,537, filed Feb. 6, 2002, titled "SOLID-STATE MICROSECOND CAPACITANCE CHARGER FOR HIGH VOLTAGE AND PULSED POWER," the contents of which is hereby incorporated by reference in its entirety.

BACKGROUND

1. Field of the Invention

The invention relates to the field of solid-state high-voltage pulse power generators.

2. Description of the Related Art

High voltage pulse generators with fast rise time are typically used to drive gas discharge loads such as lasers, devices for pollution control applications and for plasma chemistry. In the past, such pulse generators used thyratrons to generate the desired pulses. However, thyratrons are relatively unreliable and they have high complexity resulting in a high price. Solid state devices such as thyristors, MOSFET transistors and Insulated Gate Bipolar Transistors (IGBTs), although much lighter and more reliable than thyratrons, handle less power than a thyratron. In order to replace one thyratron, one needs hundreds or thousands of solid state devices.

The power that each solid state transistor can produce is restricted by its saturation current (~70 A) and by its breakdown voltage (~600V), giving a maximum pulsed power Pav=Isat×Ubd/2=21 KW. For most plasma applications, the desired pulse length is about 100 nanoseconds. This means that the pulse energy the transistor can produce is typically not higher than 2.1 mJ. If the repetition rate is increased to 50-100 kHz, then the power will have a reasonable value (100 w-200 w). The main advantage of short pulses (<100 ns) in plasma devices is the high electrical strength of the gap that permits achievement of twice or triple the mean temperature of electrons. If the repetition rate is increased to more than 1000 Hz, the residual ionization will reduce the electrical strength of the plasma gap and eliminate the advantage of short pulses. This problem is typically solved by increasing the pulse length of the solid-state pulse generator and using one more output stages to compress the power. The second stage compressor, if desired, can be a spark gap, blumline, etc. To simplify the design of the compressor, the pulse length of the charger is typically held to a few microseconds or even as short as 1-2 microseconds.

Even when using an output compressor, in order to replace one thyratron one needs hundreds or thousands of solid state devices. The cost of all these devices is comparable to the cost of one thyratron, but the reliability of solid state devices is higher. Unfortunately, summing the output of a large number of transistors via a transformer is problematic because the transformer can cause dangerous overvoltage in the transistors.

SUMMARY OF THE INVENTION

The present invention solves these and other problems by providing a solid-state high-voltage pulse generator based on a three-phase chopper capacitance charger. In the first phase, an intermediate capacitor is resonance-charged via a diode. In the second phase, the intermediate capacitor is discharged to the load through one or more solid-state switches. In the third phase, the energy remaining in the intermediate capacitor is returned to the power-supply filter capacitor.

In one embodiment, the three-phase chopper includes an intermediate capacitor that is charged by first and fourth branches of a bridge and discharged by second and third branches of a bridge. In one embodiment, each branch of the bridge includes a diode in series with an inductor. In one embodiment, a composite solid-state switch connects the intermediate capacitor to a primary winding of an output transformer such that the intermediate capacitor discharges through the primary winding. In one embodiment, a secondary winding of the output transformer is provided to an output load. In one embodiment, the output load is a reactive load. In one embodiment, the output load is a capacitive load.

In one embodiment, an output transformer is used at the output of the three-phase chopper. In one embodiment, a separate three-phase chopper is used to drive each primary winding of an output transformer having multiple primary windings. In one embodiment, the output transformer includes a split magnetic core transformer. In one embodiment, the output transformer includes a Tesla transformer. In one embodiment, the ferrite rod is made of toroidal magnetic ferrite cores.

In one embodiment, a second stage compressor is used. In one embodiment, the second stage compressor includes a blumline.

BRIEF DESCRIPTION OF THE FIGURES

The advantages and features of the disclosed invention will readily be appreciated by persons skilled in the art from the following detailed description when read in conjunction with the drawings listed below.

DETAILED DESCRIPTION

Figure 1:
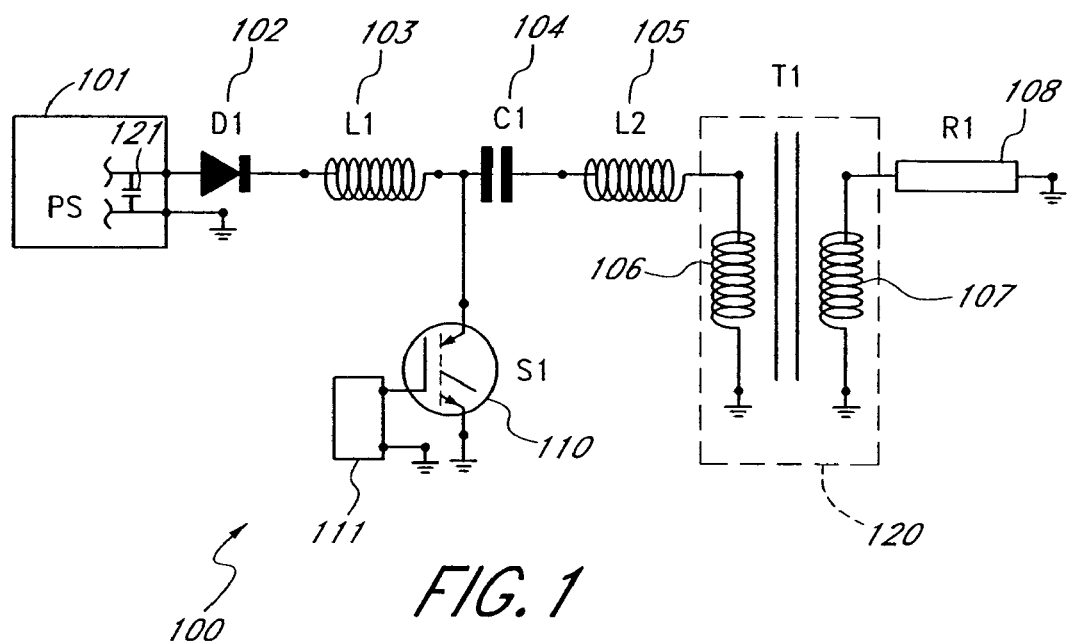
FIG. 1 shows a prior art chopper based on a resonant charging circuit.

FIG. 1 shows a simple resonance charging system 100, where a power supply 101 provides a DC output voltage through a diode 102. The power supply 101 includes a filter capacitor 121 to filter the output voltage of the power supply 101. An output of the diode 102 is provided through an inductor 103 to a first terminal of an intermediate capacitor C1 104. A second terminal of the capacitor C1 104 is provided to ground through a series connection of an inductor 105 and a primary winding 106 of a transformer 120. A solid-state switch 110 is provided between the first terminal of the intermediate capacitor C1 104 and ground. A control circuit 111 controls the solid-state switch 110. A secondary 107 of the transformer 120 is provided to a load 108. The charging system 100 doubles the voltage of the filter capacitor 121 by charging the intermediate capacitor.

In one embodiment, the capacitor C1 104 is resonance charged to 320 volts from a 160 volt DC power supply. When the solid-state switch 110 is switched on, the capacitor 104 transmits the stored energy to the load 108 via the transformer 120. The transformer 120 multiplies the voltage to a desired level. When the load 108 is resistive, the charging system 100 is stable. When the load 108 is not resistive, as in the case of a plasma application, the system 100 is extremely unstable. Consider, for example, how the charging voltage of the capacitor C1 104 depends on the quality (Q-factor) of the load 108. The Q-factor of the load is given by Q-factor=$R/\sqrt{L_{stray}/C1}$, where sqrt( ) denotes the square root, and $L_{stray}$ is a stray inductance of the transformer 120.

Figure 2:
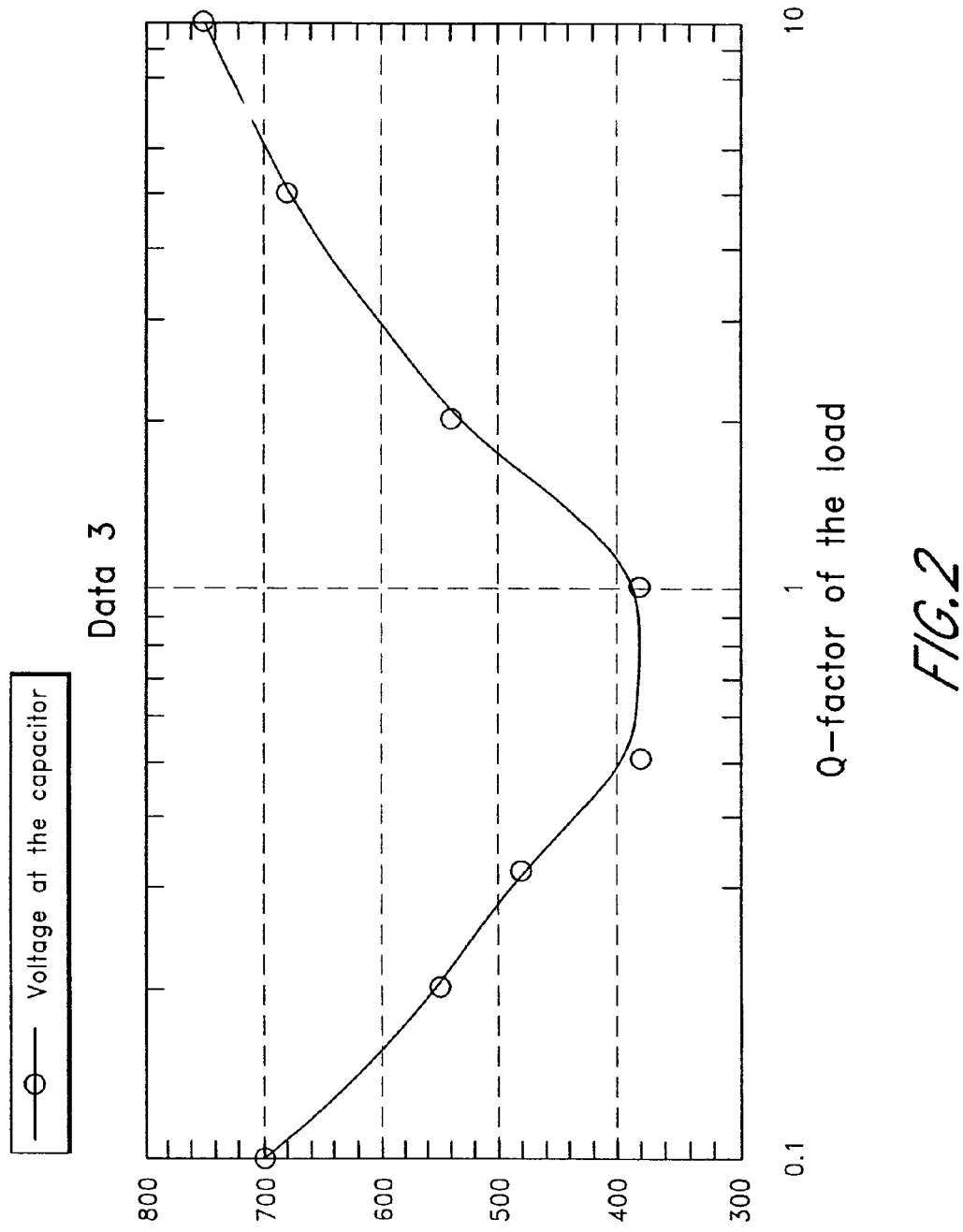
FIG. 2 shows voltage at the capacitor versus a quality factor of the tank circuit load for the chopper of FIG. 1.

FIG. 2 is a plot showing the voltage at the capacitor 104 as a function of the Q-factor of the load 108. FIG. 2 shows that the voltage on the capacitor 104 depends on the Q-factor of the load (almost doubling as the Q-factor deviates from unity). This means that the values of the voltage of the capacitor and the switch must be chosen higher than needed in order to withstand the overvoltage when working with a load having a high or low Q-factor.

Figure 3:
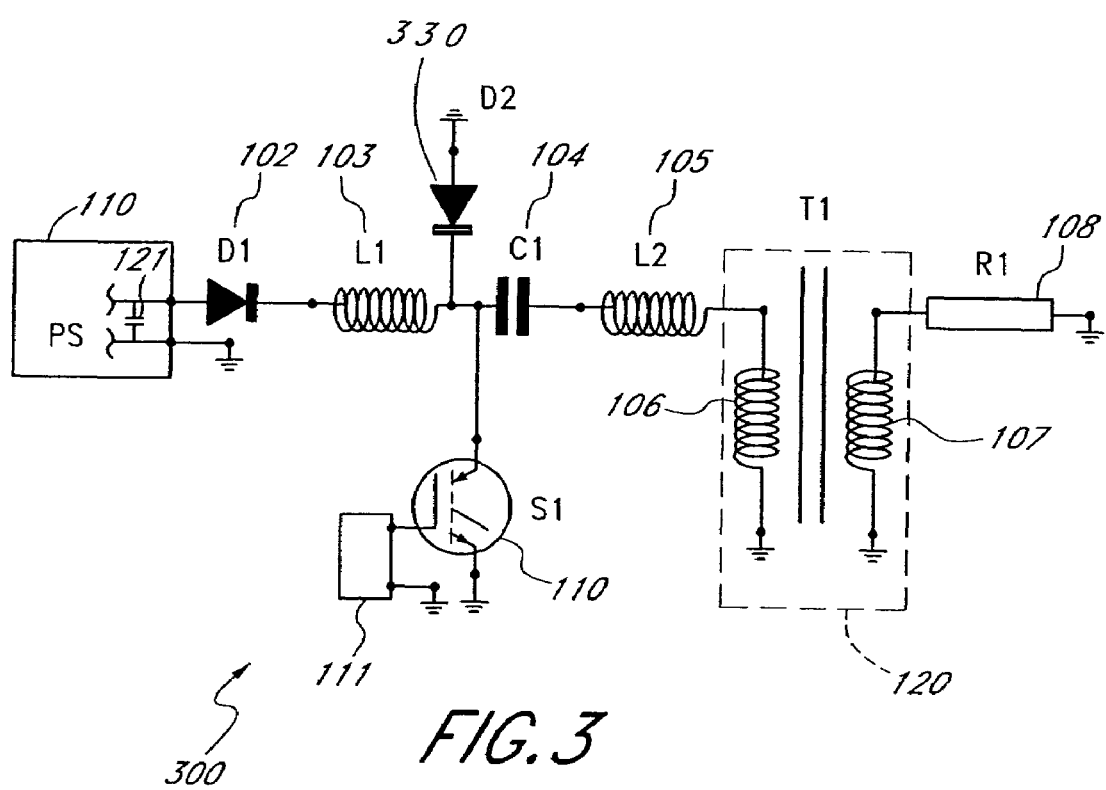
FIG. 3 shows a prior art chopper based on a resonant charging circuit with an anti-parallel diode.

FIG. 3 shows the circuit of FIG. 1 with the addition of a reverse-biased anti-parallel diode 330 connected between the first terminal of the capacitor 104 and ground. In power supply practice, such an anti-parallel diode is used to return the excess energy to the filter capacitor 121.

Figure 4:
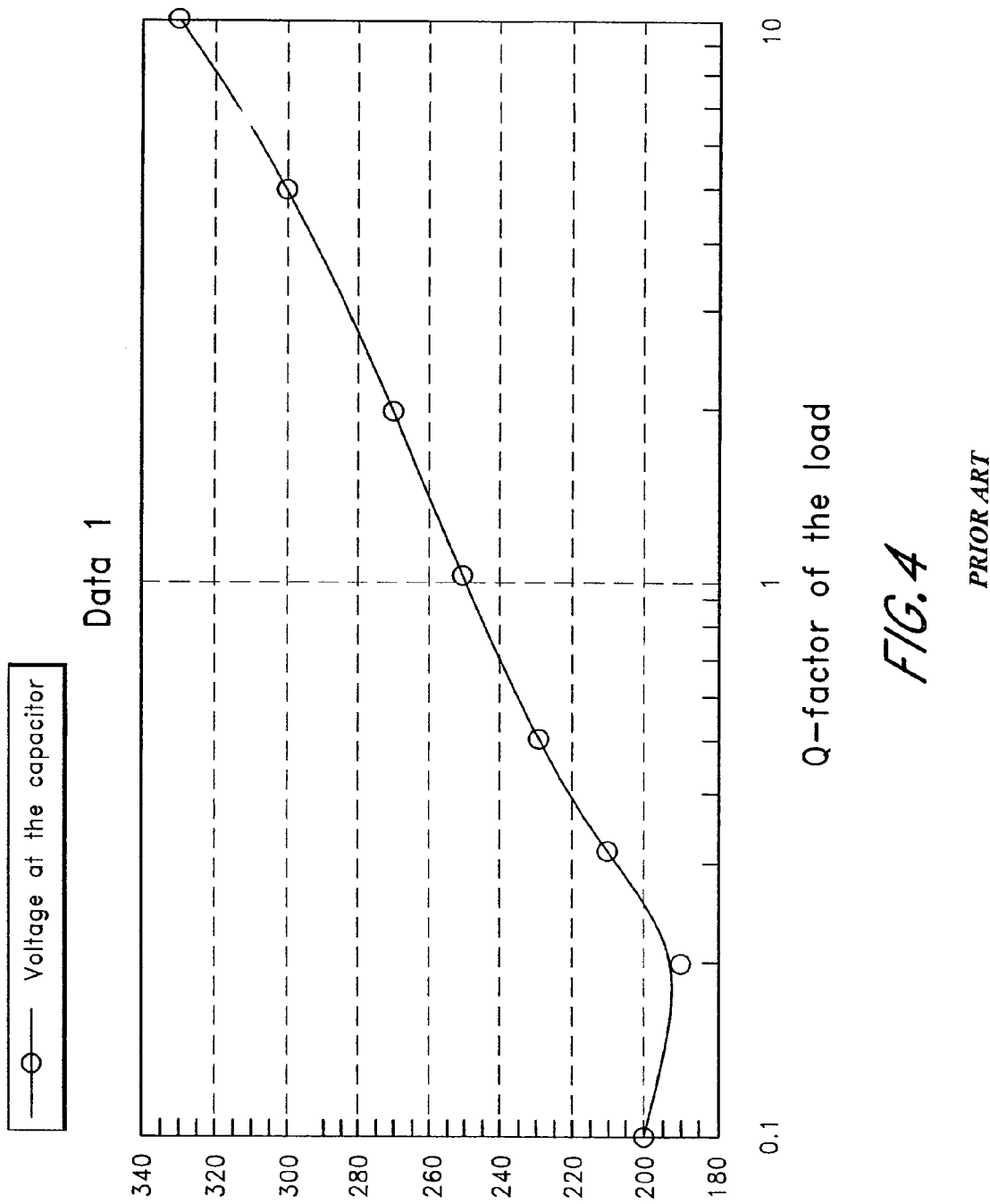
FIG. 4 shows voltage at the capacitor versus a quality factor of the tank circuit load for the chopper of FIG. 3.

FIG. 4 is similar to FIG. 2 and shows the voltage at the capacitor 104 as a function of the Q-factor of the load 108 when the diode 330 is used. In FIG. 2, the voltage approximately doubles as the Q-factor varies from 1 to 10. In FIG. 4, the voltage increases by only 32% (330 v/250 v) as the Q-factor varies from 1 to 10. Thus the diode 330 improves performance in some respects. Nevertheless, the voltage varies excessively with variations in the Q-factor of the load.

Further problems are related to the need for snubbers in the charger 100. The rise time of the voltage at the switch 110 is short even for an IGBT or a MOSFET. A snubber circuit is typically used to eliminate false switching of the switch 110. It is known that the snubber circuits consume power, generate heat, and need more space. Moreover, it is difficult to design a snubber circuit when MOSFET or IGBT transistors are working in hard parallel.

The above problems are solved herein by using a three-phase chopper. In the first phase, an intermediate capacitor is resonance charged via first and second legs of a full-wave bridge. In the second phase, the intermediate capacitor is discharged to the transformer primary through solid state switches. In the third phase, the remaining energy in the intermediate capacitor returns to the power supply filter capacitor through third and fourth legs of the full-wave bridge.

Figure 5A:
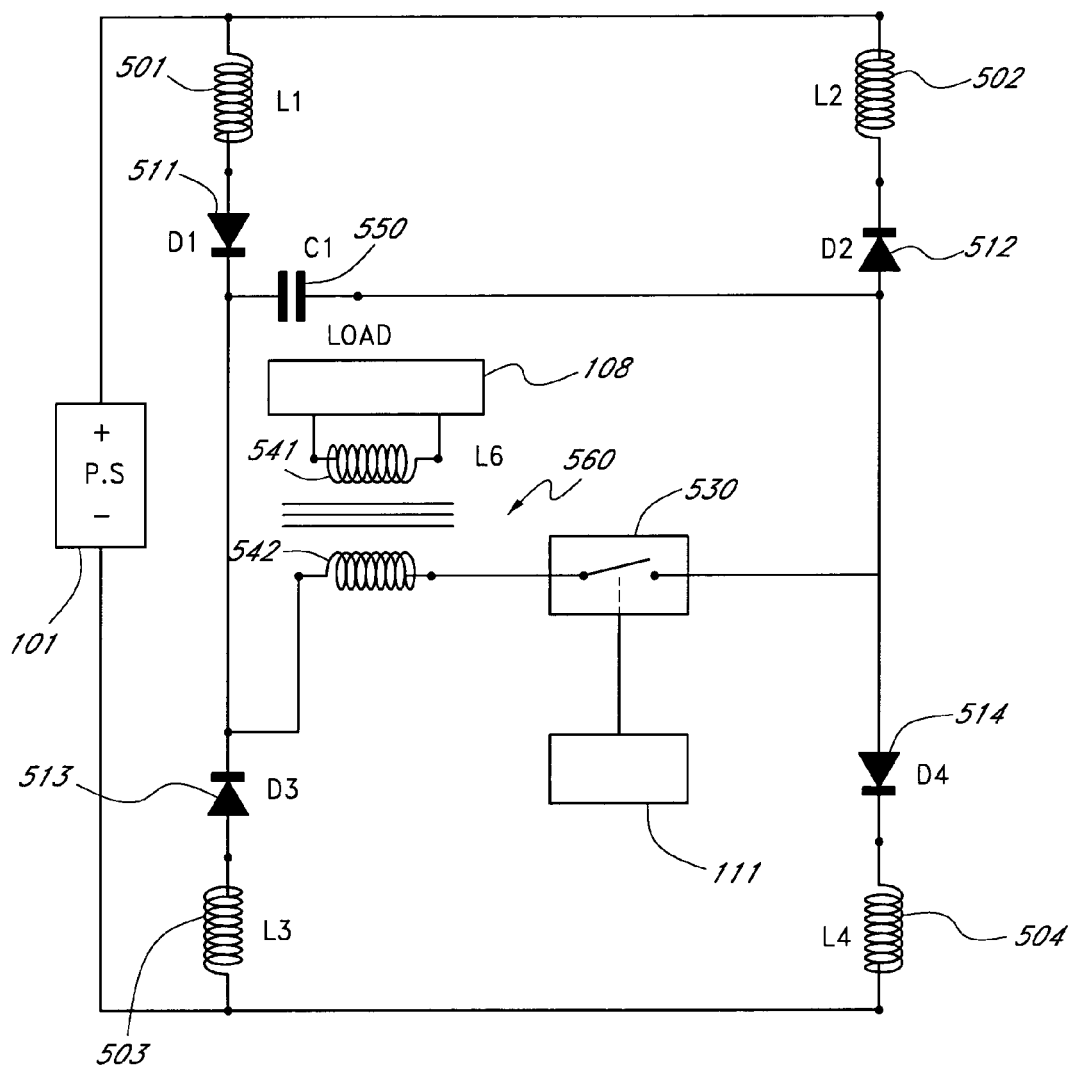
FIG. 5A shows a three-phase chopper.

FIG. 5A shows a three-phase chopper circuit 500 that avoids many of the problems identified in the circuits of FIGS. 1 and 3. The chopper 500 includes a bridge using four diode-inductor arms. An inductor L1 501 provides current from a positive supply rail to an anode of a diode D1 511. An inductor L2 502 provides current from a positive supply rail to a cathode of a diode D2 512. An inductor L3 503 provides current from a negative supply rail to an anode of a diode 513. An inductor L4 504 provides current from the negative supply rail to a cathode of a diode 514. The cathodes of diodes 511, 513 are provided to a first terminal of an intermediate capacitor 550 and to a first terminal of a primary winding 542 of a transformer 560. A second terminal of the primary winding 542 is provided to a first terminal of a solid-state switch 530. A second terminal of the solid-state switch 530 is provided to the anodes of the diodes 512, 514, and to a second terminal of the capacitor 550. A control output of a controller 111 is provided to a control input of the solid-state switch 530. A secondary winding 541 of the transformer 560 is provided to a load 108. The solid-state switch 530 can be based on solid-state switch devices including MOSFETs, IGBTs, bipolar transistors, thyristors, etc.

The topology of the three-phase chopper 500 is that of a full-wave bridge having four branches and two diagonals. One branch corresponds to the series combination of the inductor L1 501 and the diode L1 511. One branch corresponds to the series combination of the inductor L2 502 and the diode L2 512. One branch corresponds to the series combination of the inductor L3 503 and the diode L3 513. One branch corresponds to the series combination of the inductor L4 504 and the diode L4 514. The power supply 101 is provided in one of the diagonals. The capacitor C1 550 is provided in the other diagonal.

Figure 5B:
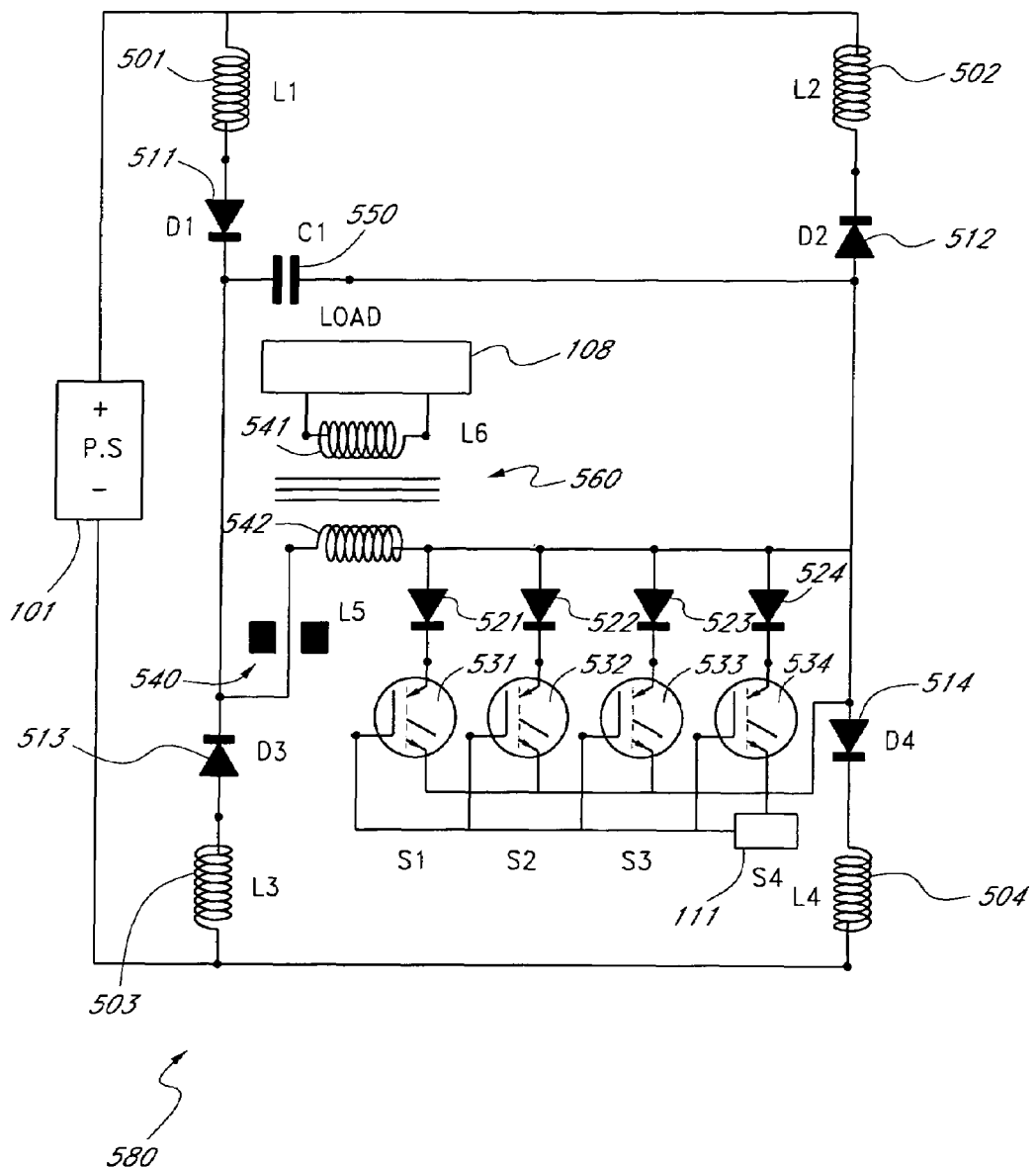
FIG. 5B shows a three-phase chopper using Insulated Gate Bipolar Transistors.

FIG. 5B shows a three-phase chopper circuit 580 that is a specific embodiment of the three-phase chopper 500. In the three-phase chopper 580, the switch 530 uses IGBTs. The chopper 580 includes the bridge using four diode-inductor arms. The inductor L1 501 provides current from a positive supply rail to the anode of the diode D1 511. The inductor L2 502 provides current from the positive supply rail to the cathode of the diode D2 512. The inductor L3 503 provides current from the negative supply rail to the anode of the diode 513. The inductor L4 504 provides current from the negative supply rail to the cathode of the diode 514. The cathodes of diodes 511, 513 are provided to the first terminal of the intermediate capacitor 550 and through the inductor 540 to the first terminal of the primary winding 542 of the transformer 560. The second terminal of the primary winding 542 is provided to anodes of four diodes 521-524. Cathodes of the diodes 521-524 are provided, respectively, to the first terminal of the solid-state switches S1-S4 531-534. The second terminals of the solid-state switches 531-534 are provided to the anodes of the diodes 512, 514, and to the second terminal of the capacitor 550. The control output of the controller 111 is provided to control inputs of the parallel solid-state switches 531-534. The secondary winding 541 of the transformer 560 is provided to the load 108. The parallel solid-state switches 531-534 can be solid-state switch devices including MOSFETs, IGBTs, bipolar transistors, thyristors, etc.

In the first phase, the three-phase chopper 500, provides resonant charging of the capacitor C1550 through the diodes D1511, D4 503 and through the inductors L1 501, L4 503. The resonant charging approximately doubles the voltage of power supply 2 Vpc. The second phase includes discharging the capacitor 550 to the load 108 via the transformer. If the discharge has good damping (e.g., the negative cycle of the sine wave is less than half of the positive cycle), then the diodes D2 512 and D3 513 do not conduct and the third phase is not used. If the discharge does not have a good damping (e.g., the negative sine cycle is more than half of the positive cycle), the diodes D2 512 and D3 513 conduct and return the energy to the power supply (phase 3). When this third phase is over the first phase starts again.

Figure 6:
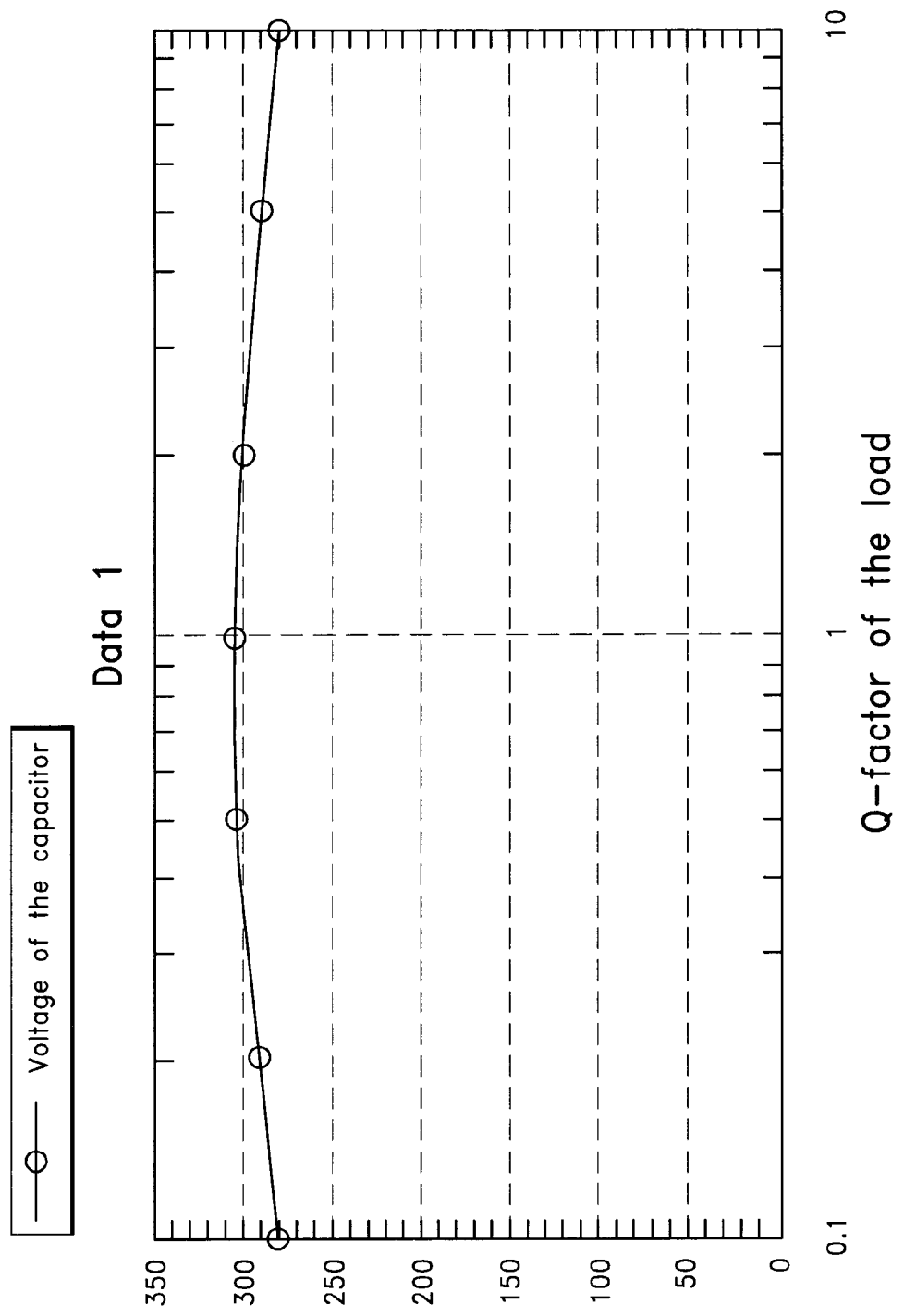
FIG. 6 shows voltage at the capacitor versus a quality factor of the tank circuit load for the chopper of FIGS. 5A-B.

FIG. 6, like FIGS. 2 and 4, shows the capacitor voltage versus Q-factor of the load for the three-phase choppers 500, 580. FIG. 6 shows that the middle of the curve (where Q is roughly equal to 1) is about 20% higher than the ends of the curve (where Q is roughly equal to 0.1 and 10). The voltage reaches maximum when the circuit works at maximum power. When the power decreases because of poor load matching, the voltage of the capacitor and the switch decreases somewhat. When the load 108 has reactive components, it reduces the voltage at the capacitor and the switch instead of increasing it, thus providing good safe-operating margins.

Figure 7:
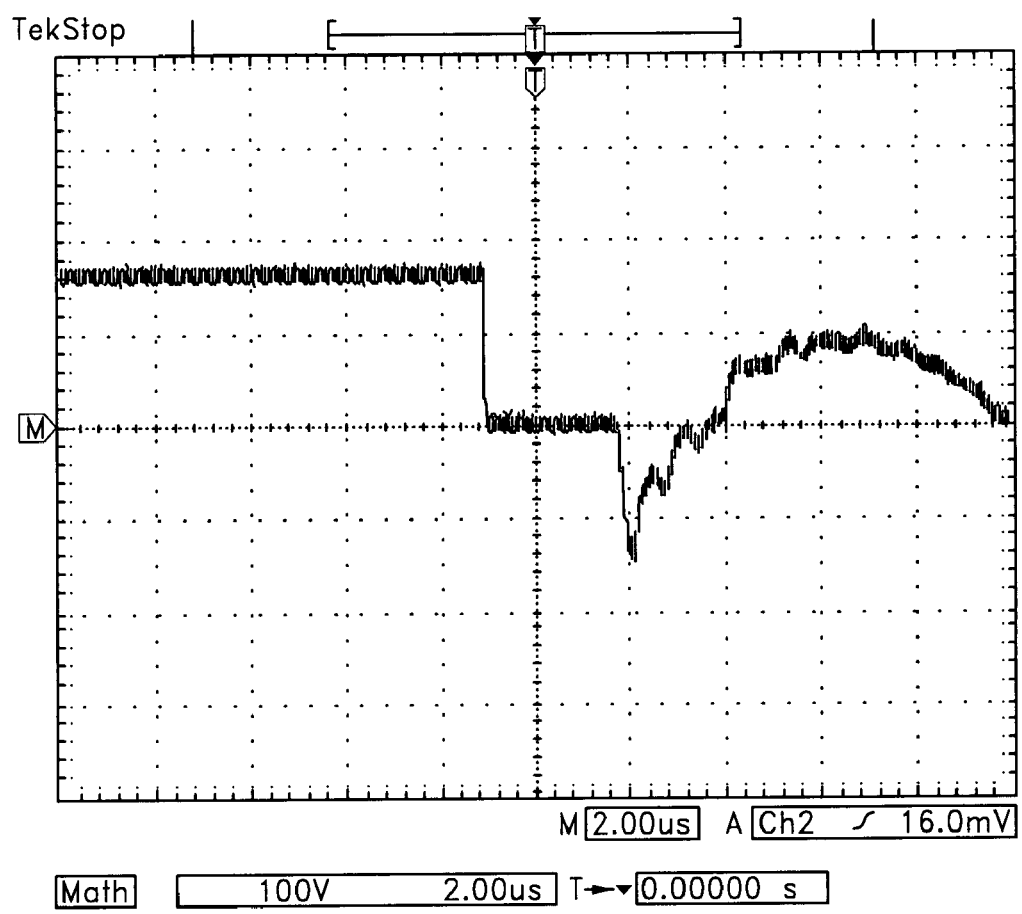
FIG. 7 shows voltage at the switch for the three-phase chopper, including recovery of the voltage at the switch.

FIG. 7 shows one example of the voltage across the four parallel solid-state switches 531-534 together with the four diodes 521-524. FIG. 7 shows that the voltage across the switch/diode combinations drops very quickly from 170V to zero. In one embodiment, the conduction time is about 3 us. After the conduction time is over, a negative voltage appears at the anode and restores the voltage to 150V at a speed of approximately 75 V/us. The three-phase chopper 500 provides good performance without the need for snubbers.

In one embodiment, the switches 531-534 are IGBTs configured to work as thyristors, wherein the conduction time for the driver is approximately 30% more than the current pulse. The diodes 521-524 stop the current when it changes polarity. The inductor 540, typically a ferrite core with one winding, reduces any overvoltage that occurs when the diodes 521-524 turn off.

In one embodiment, the load 108 includes a high voltage capacitor that is charged from the capacitor 550 via the transformer 560. The transformer steps up the voltage to a desired voltage. In one embodiment, a relatively high reactive power is provided at the output of the charger. In one embodiment, the transformer 560 includes a Tesla transformer. In one embodiment, the transformer 560 includes a split-core transformer.

Figure 8:
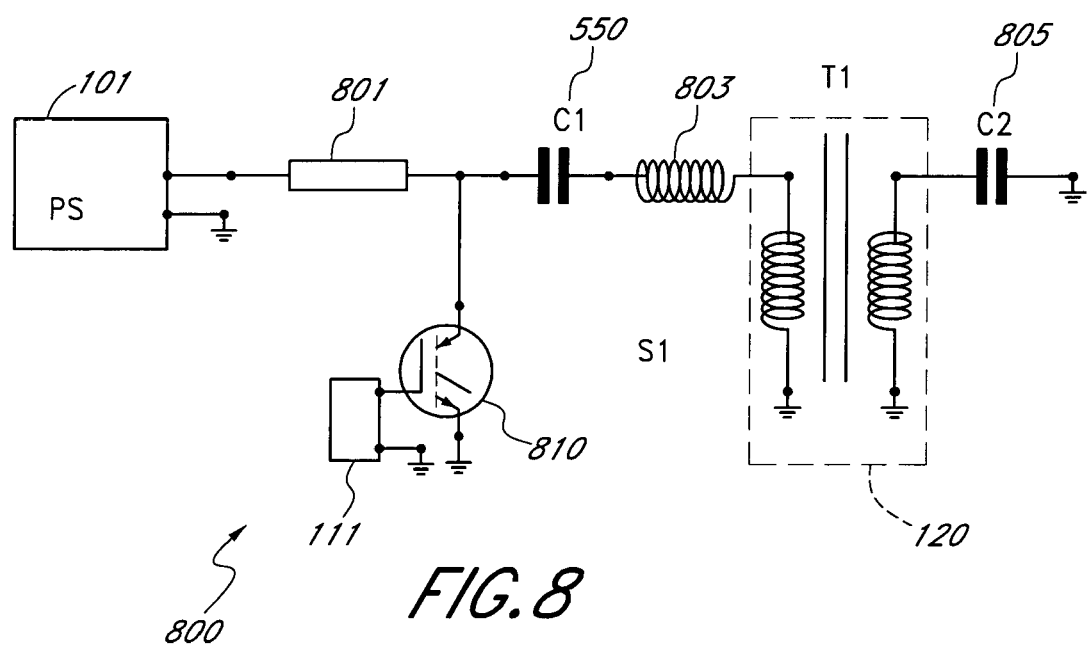
FIG. 8 shows a circuit for calculating transmission versus coupling for the capacitance charger.

The efficiency of the system is dependent on the coupling coefficient of the transformer 560. FIG. 8 shows a circuit for calculating transmission versus coupling for the capacitance charger 500. In FIG. 8, the primary capacitance is C1 550 and the secondary capacitance is a capacitor C2 805. The circuit of FIG. 8 is similar to the circuit of FIG. 1, except that in FIG. 8, the load 108 has been replaced by the capacitor C2 805.

Figure 9:
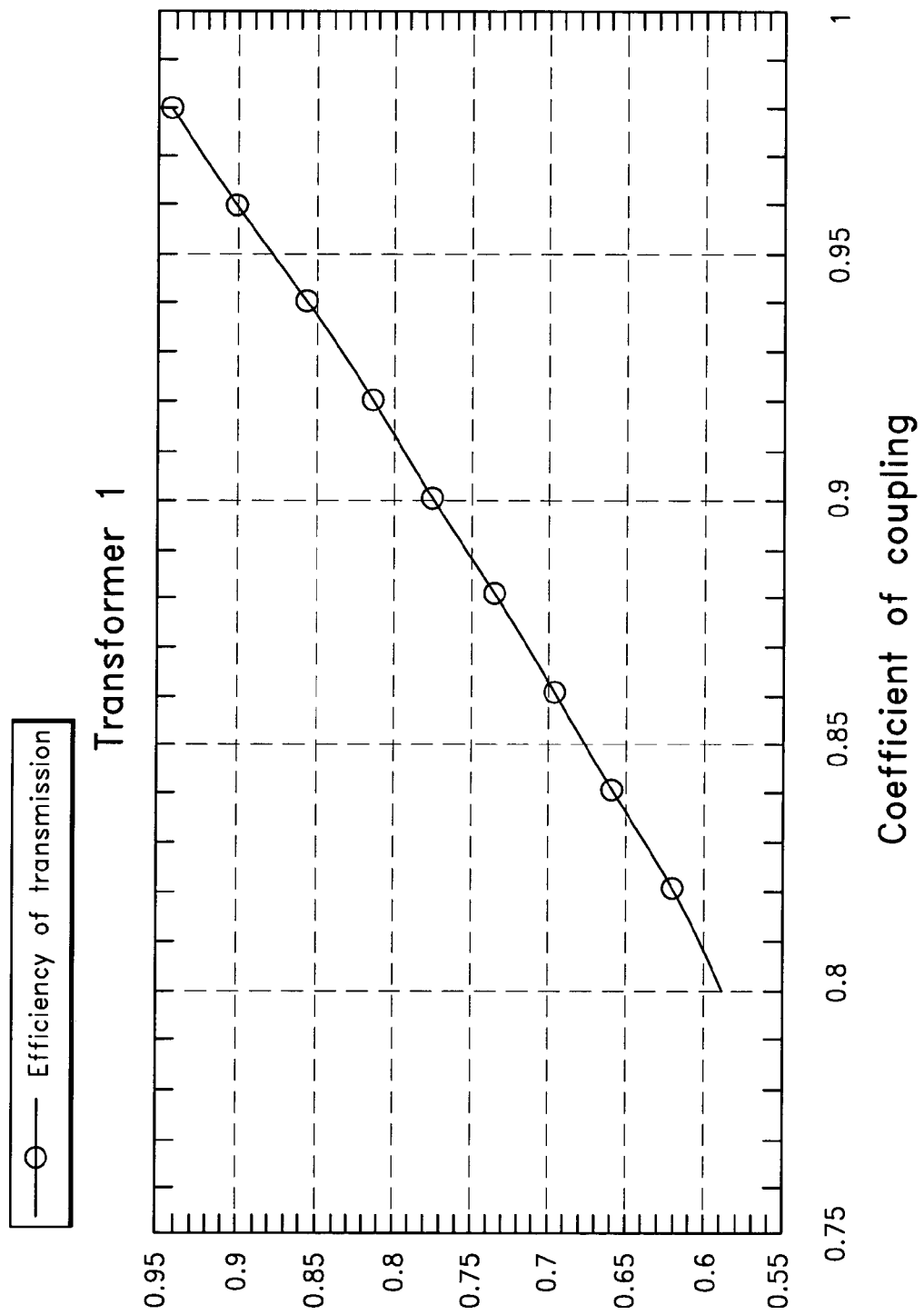
FIG. 9 shows energy transmission between the capacitance C1 and the capacitance C2 versus coupling for the capacitance charger.

FIG. 9 shows energy transmission between the capacitance C1550 and C2 805 versus coupling of the transformer 120. FIG. 9 shows that an efficiency of more than approximately 80% corresponds to coupling between the windings of approximately 0.9 or more.

Figure 10:
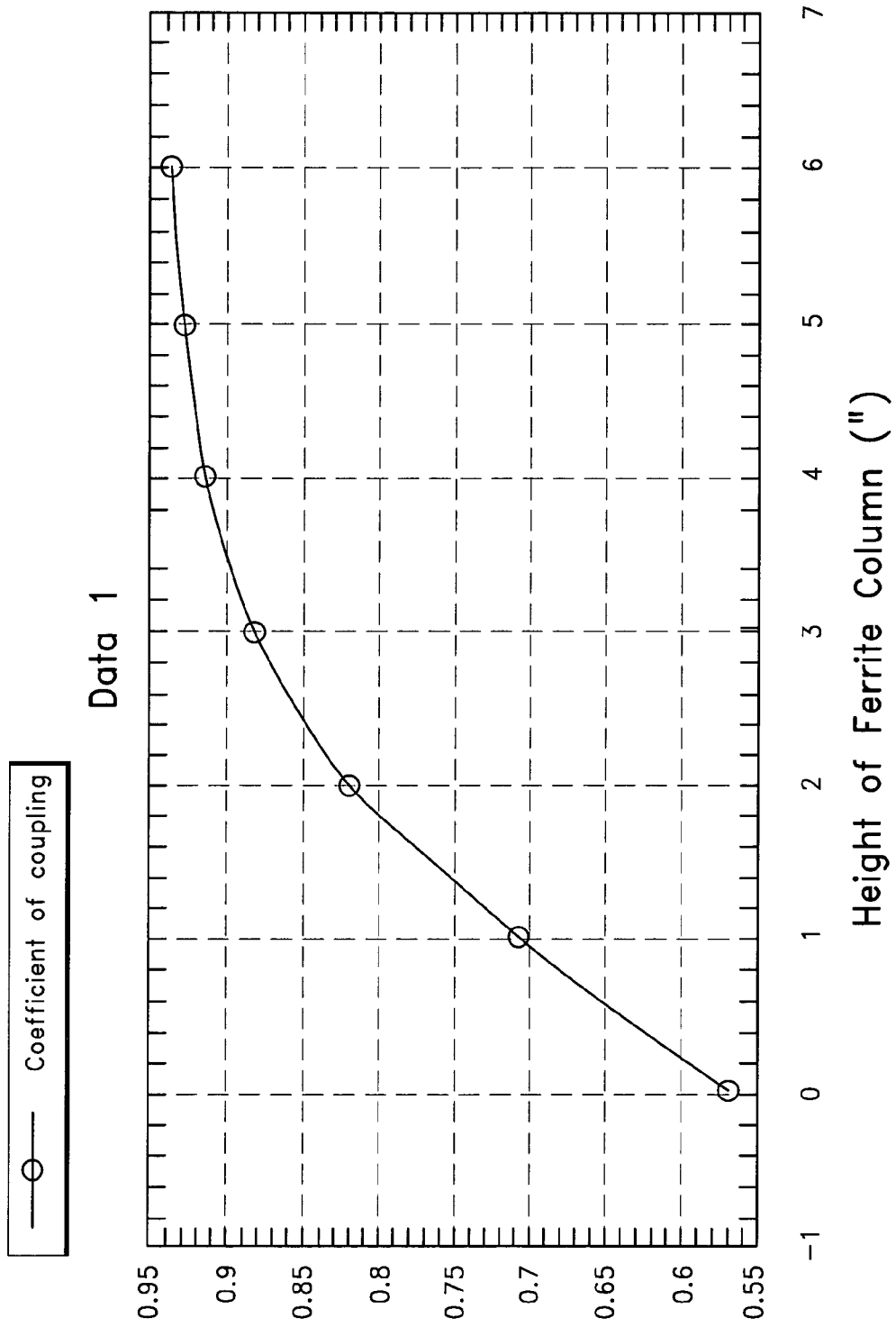
FIG. 10 shows coupling between primary and secondary windings of the Tesla transformer versus the height of the ferrite column.
Figure 11:
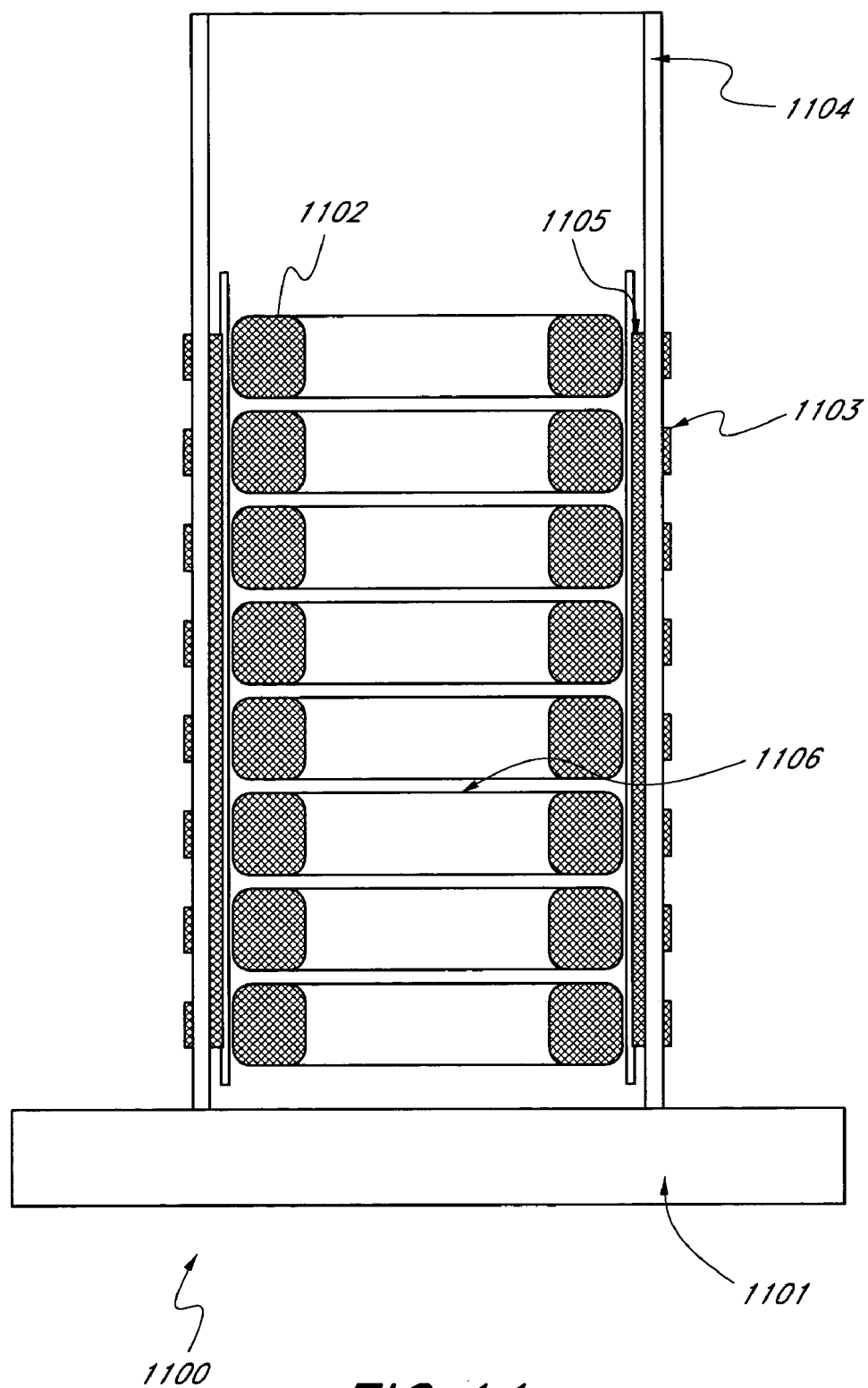
FIG. 11 shows a Tesla transformer for use with the capacitance charger.

A typical Tesla high voltage transformer has a coupling coefficient between 0.5-0.6. However, when a ferrite is inserted in the inner winding of the Tesla transformer, the coupling can be substantially improved. The coupling coefficient of such transformer is shown in FIG. 10 and the transformer is shown in FIG. 11. The transformer of FIG. 11 includes one or more ferrite cores 1102 and an insulating (e.g., plastic, lexan, etc.) tube 1104. A partial insulation 1106 between the cores prevents electrical breakdown between the high voltage winding and the ferrite cores. A primary winding is placed on the outer diameter of the insulating tube 1104. The insulating tube 1104 provides insulation, especially when the electrical field is relatively undisturbed.

FIG. 10 shows example measured data of the transformer shown in FIG. 11 when the height of the primary and secondary windings is 6", and the main insulation tube has an outside diameter OD=2.75" and an inside diameter ID=2.5". In one embodiment, twelve ferrite cores OD=2.4", ID=1.4" and T=0.5" are the cores of the transformer. FIG. 10 shows the coefficient of coupling between windings versus height of the column of ferrite. The transformer provides only 0.58 coupling without the ferrite. The transmission is less than 30% without ferrite. By changing the height of the ferrite column to 6" the coupling coefficient increases to 0.94 and the transmission to 85%.

Figure 12:
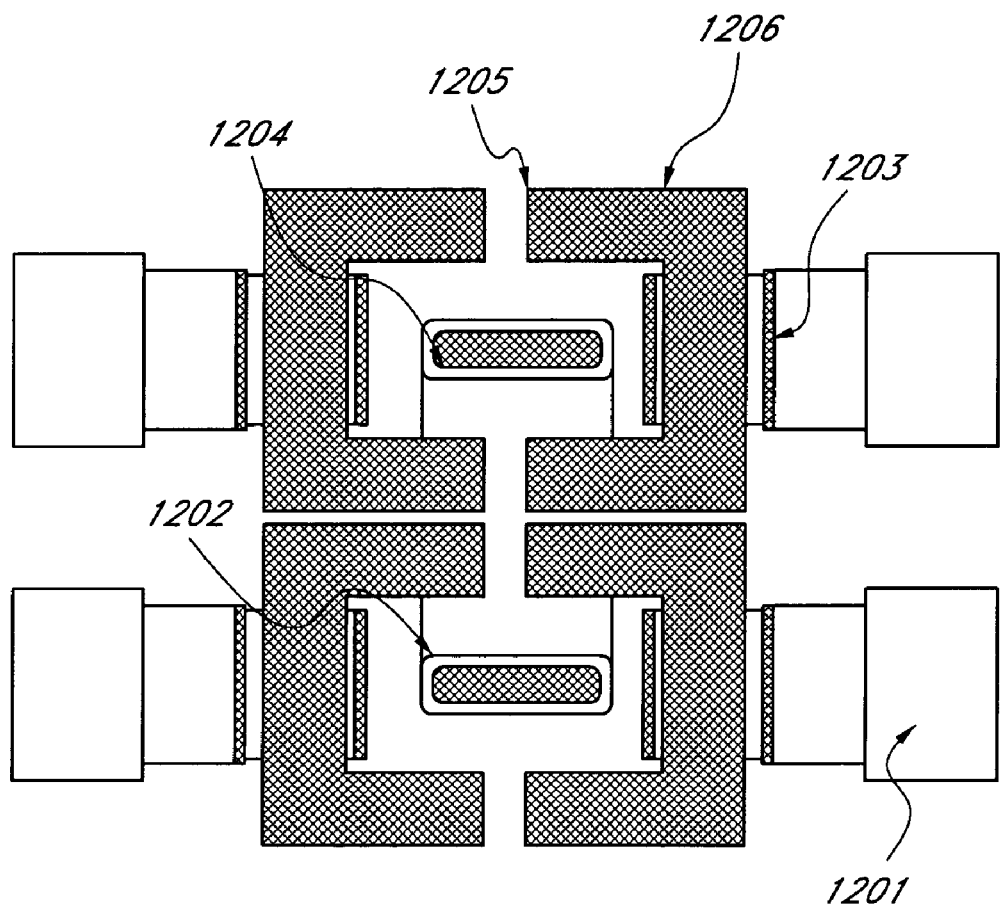
FIG. 12 shows a cross section view of a split-core transformer for use with the capacitance charger.
Figure 13:
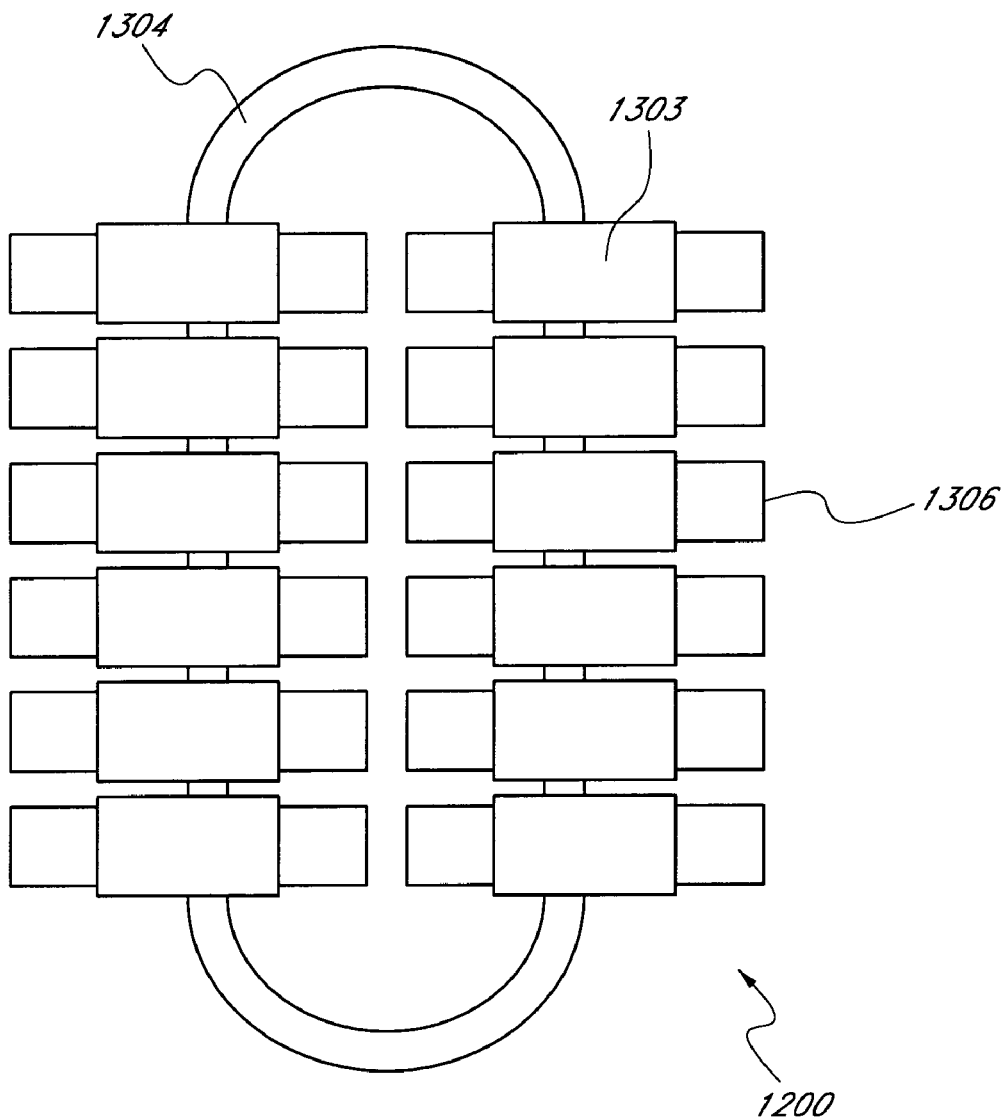
FIG. 13 shows a side view of the split-core transformer for use with the capacitance charger.

In one embodiment, the output transformer includes a split magnetic core transformer 1200 as shown in FIGS. 12 and 13. The cores of the transformer 1200 include one or more air gaps. The air gaps are provided because of the presence of unipolar pulses at the output of the chopper and a low duty factor. Without the air gaps the unipolar pulses may saturate the transformer. The air gaps provide a long negative pulse between positive pulses. If the duty factor is high, the air gaps can produce oscillation. In one embodiment, one air gap is replaced with two gaps of half the size. This allows the high voltage winding to be made separately and then insert it between two cores. In one embodiment, a resin fill is used.

Figure 14:
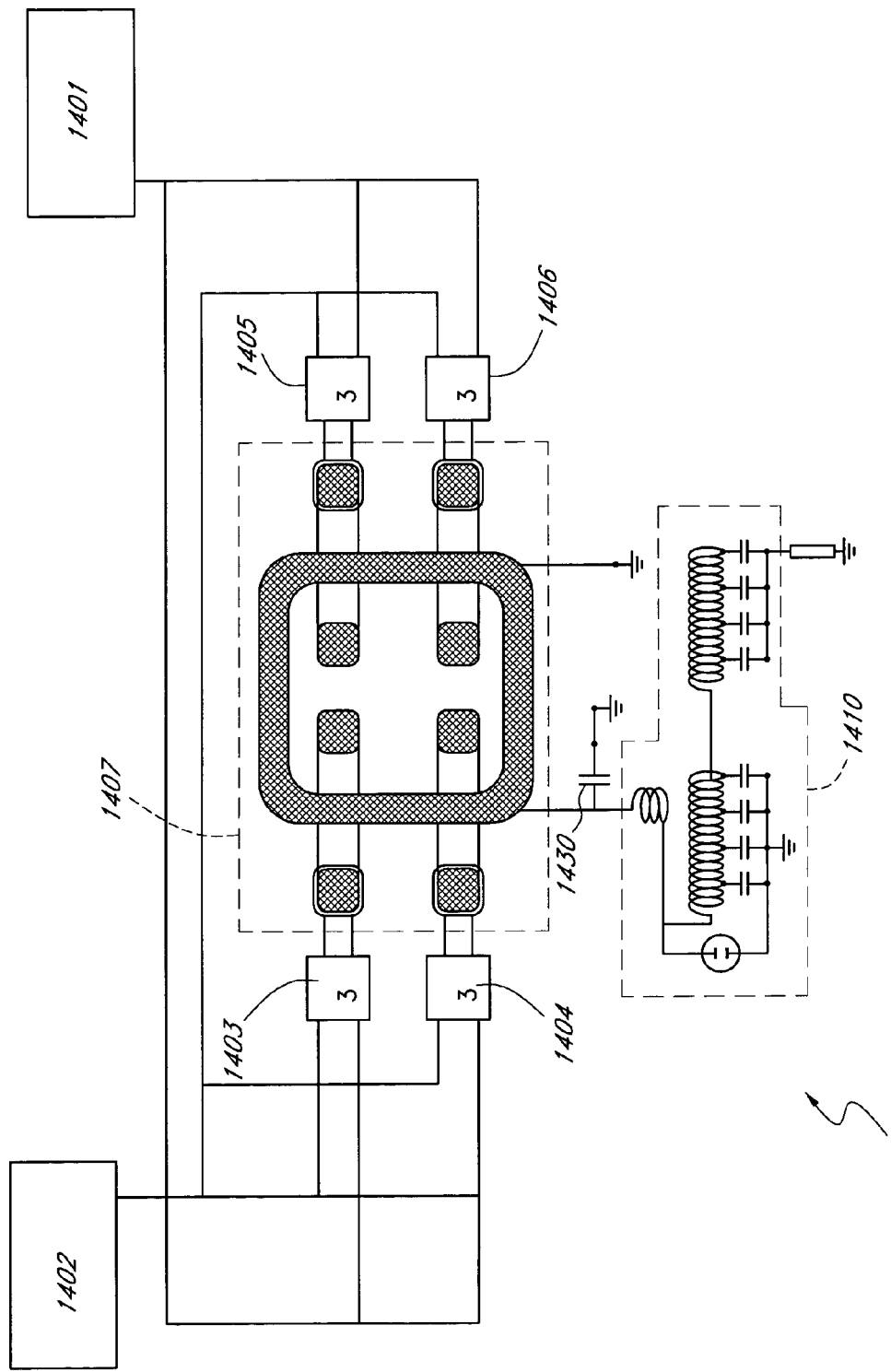
FIG. 14 shows one embodiment of a capacitance charger with a split-core transformer having four primary windings and a blumline compressor.

FIG. 14 shows one embodiment of a capacitance charger 1400 with a split-core transformer 1407 having four primary windings, one secondary winding, and a secondary blumline compressor 1410. The charger 1400 includes four choppers 1403-1406. Each chopper 1403-1406 corresponds to the chopper 500 shown in FIG. 5. Each chopper 1403-1406 drives a separate primary winding of the transformer 1407. In one embodiment, each primary winding of the transformer 1407 has three turns in four parallel wires. In one embodiment, the secondary winding of the transformer 1407 has 32 turns. The coupling coefficient of the transformer is approximately 42.6. A power supply 1401 provides DC power to the choppers 1403-1406. In one embodiment, the power supply 1401 includes a rectifier bridge which rectifies standard 110 volt AC to produce a DC output of approximately 160V. A control circuit 1402 controls all of the choppers 1403-1406, providing them with a 3us pulse of 16. The total energy stored in the intermediate capacitors 550 in the choppers 1403-1406 is 190 mJ. In one embodiment, the efficiency of the transmission of the energy to a 1000 pF high voltage capacitor 1430 is 81%.

Figure 15:
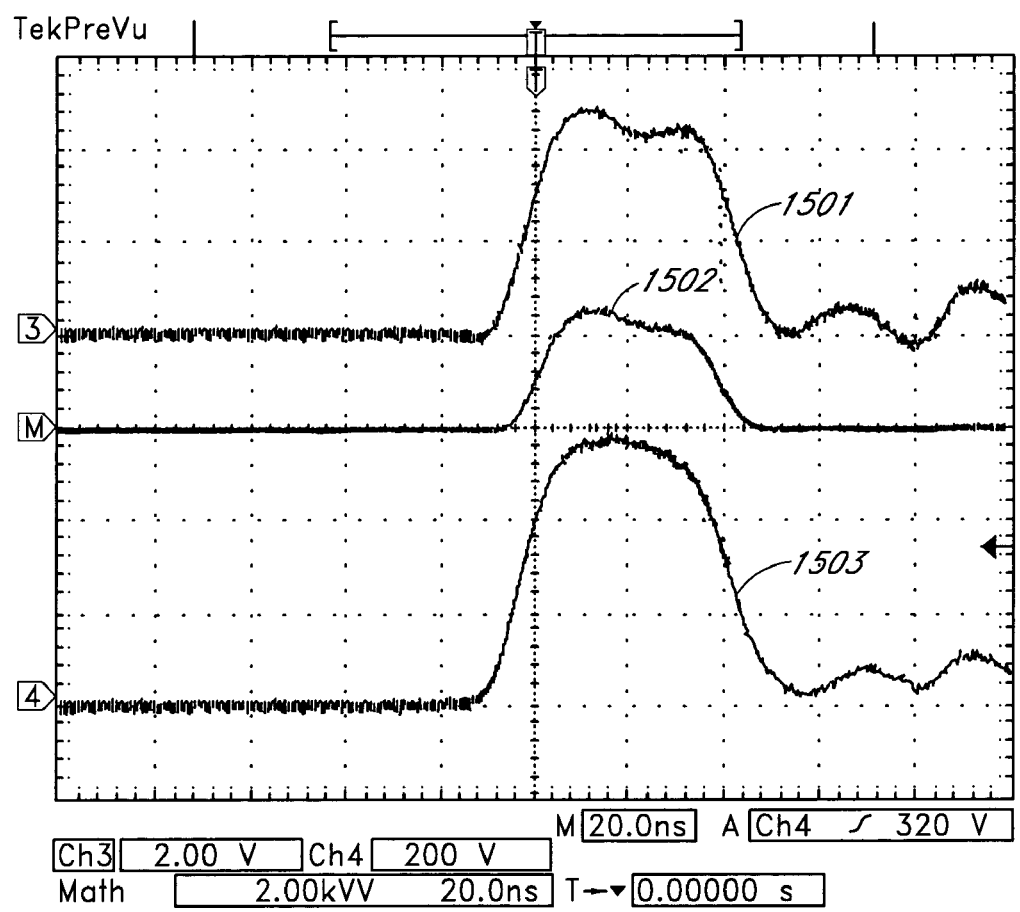
FIG. 15 shows a response of the blumline charged with a microsecond capacitance charger.

An example of the final pulse at the end of the blumline 1410 is shown at FIG. 15. At 100 Ohms, the amplitude is 11.5 kV (shown as a curve 1503). The current is 95 A and the rise time of the voltage is 13 ns. The length of the pulse is 42 ns. The repetition rate is 1 kHz. The whole system (the charger and the compressor) can operate at up to 5 kHz. The measurements made for the customer showed a high reliability of the whole system.

Figure 16:
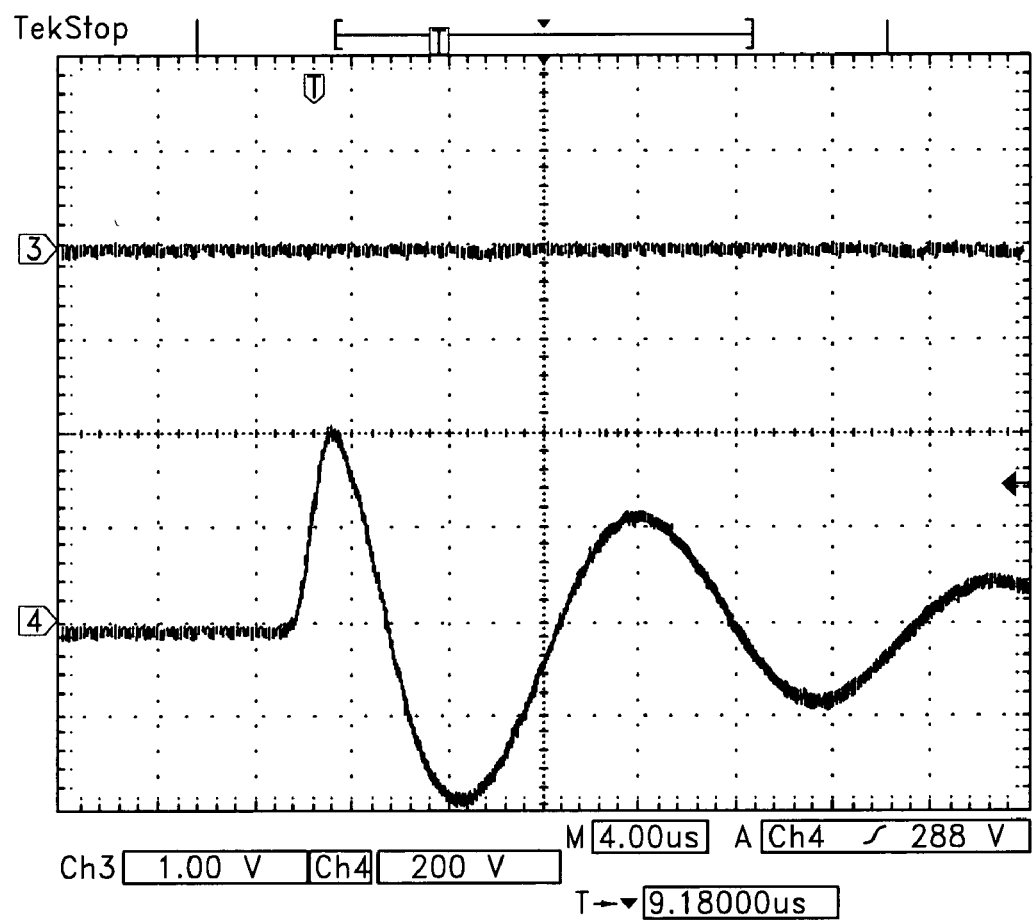
FIG. 16 shows an output of the capacitance charger of FIG. 14.

FIG. 16 shows an example output voltage of the capacitance charger 1400 at 1000 pf capacitance, where the output is 10 KV and the charging time is 1.6 us.

Although the foregoing has been a description and illustration of specific embodiments of the invention, various modifications and changes can be made thereto by persons skilled in the art without departing from the scope and spirit of the invention. Accordingly, the invention is limited only by the claims that follow.

What is claimed is:

1. A solid-state high-voltage pulse generator comprising:
   a reactive bridge having first, second, third, and fourth branches and first and second diagonals, each of said first, second, third, and fourth branches comprising a diode, said first diagonal comprising a power supply source of direct-current to provide direct-current to said first diagonal, said power supply having an output filter capacitor;
   an intermediate capacitor provided across said second diagonal, said intermediate capacitor charged by said power supply through said first and third branches to a voltage substantially higher than a voltage of said power supply, said intermediate capacitor discharged to said filter capacitor by said second and fourth branches;
   an output transformer having at least one primary winding and at least one secondary winding;
   a series circuit comprising a solid-state switch in series with said primary winding, said series circuit provided in parallel with said intermediate capacitor; and
   a control circuit to control said solid-state switch.

2. The solid-state high-voltage pulse generator of claim 1, wherein each of said first, second, third and fourth branches comprises a diode in series with an inductor.

3. A solid-state high-voltage pulse generator comprising:
   a reactive bridge having four branches wherein each branch comprises a diode;
   a DC power supply having an output filter capacitor, said DC power supply providing DC current to a first diagonal of said bridge;
   a first capacitor provided to a second diagonal of said branch, said first capacitor charged by current through first and fourth branches of said bridge to a voltage higher than a voltage of said power supply and discharged by current through second and third branches of said bridge;
   a solid-state switch configured to provide said capacitor to a primary winding of an output transformer; and
   a control circuit to control said solid-state switch.

4. The solid-state high-voltage pulse generator of claim 3, wherein said solid-state switch comprises a plurality of solid-state devices provided in parallel.

5. The solid-state high-voltage pulse generator of claim 3, wherein each branch of said bridge comprises a diode in series with an inductor.

6. The solid-state high-voltage pulse generator of claim 3, wherein said output transformer comprises multiple primary windings.

7. The solid-state high-voltage pulse generator of claim 3, wherein a secondary winding of said output transformer is provided to a capacitor.

8. The solid-state high-voltage pulse generator of claim 3, wherein a pulse shape of a pulse provided by a secondary winding of said output transformer is compressed by a compressor circuit.

9. The solid-state high-voltage pulse generator of claim 3, wherein said output transformer comprises a split-core transformer.

10. The solid-state high-voltage pulse generator of claim 3, wherein said output transformer comprises a Tesla transformer.

11. The solid-state high-voltage pulse generator of claim 10, wherein said output transformer comprises a Tesla transformer with at least a partial ferrite core.

12. A method for producing a high-voltage pulse, comprising:
    resonance charging a capacitor using direct current provided by a direct-current power supply through first and second legs of a reactive bridge such that a voltage across said capacitor is substantially hither than a voltage of said direct-current power supply;
    closing a solid-state switch to connect a primary winding of an output transformer between said first and second legs;
    discharging said capacitor to said primary winding; and
    returning charge remaining in said capacitor to said power-supply through third and fourth legs of said bridge.

13. The method of claim 12, wherein said solid-state switch comprises a plurality of solid-state devices in parallel.

14. The method of claim 12, wherein each branch of said bridge comprises a diode in series with an inductor.

15. The method of claim 12, wherein said output transformer comprises multiple primary windings.

16. The method of claim 12, further comprising providing an output pulse from said output transformer to a capacitor.

17. The method of claim 12, further comprising compressing an output pulse of said output transformer.

18. The method of claim 12, wherein said output transformer comprises a split-core transformer.

19. The method of claim 12, wherein said output transformer comprises a Tesla transformer.

20. The method of claim 12, wherein said output transformer comprises a Tesla transformer with at least a partial ferrite core.

21. An apparatus for producing a high-voltage pulse, comprising:
    a full-wave reactive bridge comprising first, second, third, and fourth legs;
    means for resonance charging a capacitor to a voltage higher than an input voltage using current from a direct-current power source, through said first and second legs;
    means for partially discharging said capacitor to a primary winding of an output transformer; and
    means for further discharging said capacitor through said third and fourth legs.

22. The apparatus of claim 21, further comprising means for compressing an output pulse of said output transformer.

23. A solid-state high-voltage pulse generator comprising:
    a full-wave bridge having first, second, third, and fourth branches, wherein each of said first, second, third, and fourth branches comprises a diode in series with a reactive element;
    a direct current power supply provided to said full-wave bridge, said direct current power supply providing direct-current to said bridge;

a first capacitor provided between said first and fourth branches such that said capacitor is charged by said direct current through said first and fourth branches and discharged by current through said second and third branches to a voltage higher than a voltage of said direct current power supply;

a solid-state switch configured to connect a primary winding of an output transformer in parallel with said capacitor such that said capacitor discharges through said primary winding; and a control circuit to control said solid-state switch.

24. The solid-state high-voltage pulse generator of claim 23, wherein said solid-state switch comprises a plurality of solid-state devices in parallel.

25. The solid-state high-voltage pulse generator of claim 24, wherein each branch of said bridge comprises a diode in series with an inductor.

26. The solid-state high-voltage pulse generator of claim 24, wherein said solid-state switch comprises one or more Insulated Gate Bipolar Transistors.

27. The solid-state high-voltage pulse generator of claim 24, wherein said solid-state switch comprises one or more MOSFETS.

28. The solid-state high-voltage pulse generator of claim 24, wherein said solid-state switch comprises one or more thyristors.

29. The solid-state high-voltage pulse generator of claim 1, wherein reactive elements in said first and third branches comprise sufficient inductive reactance to at least double the voltage provided from said power supply to said intermediate capacitor.

* * * * *

UNITED STATES PATENT AND TRADEMARK OFFICE
CERTIFICATE OF CORRECTION

| | | |
|---|---|---|
| PATENT NO. | : 7,307,362 B1 | Page 1 of 1 |
| APPLICATION NO. | : 10/351644 | |
| DATED | : December 11, 2007 | |
| INVENTOR(S) | : Joseph Yampolsky | |

It is certified that error appears in the above-identified patent and that said Letters Patent is hereby corrected as shown below:

In column 3 line 38, change "$L_{stay}$" to --$L_{stray}$--.

In column 4 at line 44, change "C1550" to --C1 550--.

In column 4 at line 51, change "D1511" to --D1 511--.

In column 5 at line 7, change "C1550" to --C1 550--.

In column 5 at line 8, change "D1511" to --D1 511--.

In column 5 at line 66, change "C1550" to --C1 550--.

In column 8 line 16, in Claim 12, change "hither" to --higher--.

Signed and Sealed this

Twenty-sixth Day of August, 2008

JON W. DUDAS
*Director of the United States Patent and Trademark Office*